United States Patent
Ausserlechner et al.

(10) Patent No.: US 9,404,990 B2
(45) Date of Patent: Aug. 2, 2016

(54) SENSOR OFFSET ERROR COMPENSATION SYSTEMS AND METHODS USING A CORRECTION FACTOR

(71) Applicant: Infineon Technologies AG, Neubiberg (DE)

(72) Inventors: Udo Ausserlechner, Villach (AT); Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/598,398

(22) Filed: Jan. 16, 2015

(65) Prior Publication Data

US 2015/0160325 A1    Jun. 11, 2015

Related U.S. Application Data

(63) Continuation of application No. 13/477,847, filed on May 22, 2012, now abandoned.

(51) Int. Cl.
| | |
|---|---|
| *G01R 33/07* | (2006.01) |
| *G01R 35/00* | (2006.01) |
| *G01R 33/09* | (2006.01) |
| *G01D 3/036* | (2006.01) |

(Continued)

(52) U.S. Cl.
CPC ............... *G01R 35/00* (2013.01); *G01D 3/036* (2013.01); *G01L 1/12* (2013.01); *G01R 33/07* (2013.01); *G01R 33/072* (2013.01); *G01R 33/091* (2013.01); *G01D 5/145* (2013.01)

(58) Field of Classification Search
CPC .......... G01D 3/036; G01D 5/145; G01L 1/12; G01R 33/07; G01R 33/072; G01R 33/091; G01R 35/00

USPC .................................................. 324/202, 225
See application file for complete search history.

(56) References Cited

U.S. PATENT DOCUMENTS

| | | |
|---|---|---|
| 4,037,150 A | 7/1977 | Taranov |
| 4,833,406 A | 5/1989 | Foster |

(Continued)

FOREIGN PATENT DOCUMENTS

| | | |
|---|---|---|
| CN | 102313562 A | 1/2012 |
| EP | 0758739 A1 | 2/1997 |
| WO | WO 2004/025742 | 3/2004 |

OTHER PUBLICATIONS

Office Action dated Apr. 3, 2015 for Chinese Patent Application No. 2013101906235 (with English translation).

(Continued)

*Primary Examiner* — Jay Patidar
(74) *Attorney, Agent, or Firm* — Schiff Hardin LLP

(57) ABSTRACT

Embodiments relate to reducing offset error in sensor systems. In embodiments, the sensitivity and offset of a sensor depend differently on some parameter, e.g. voltage, such that operating the sensor at two different values of the parameter can cancel the offset error. Embodiments can have applicability to stress sensors, Hall plates, vertical Hall devices, magnetoresistive sensors and others. The offset error can be reduced using a correction factor based on a first offset error of the sensor system when operated in a first phase and a second offset error of the sensor system when operated in second first phase. The sensor system can generate an output signal based on first and second output signals generated when operating in the first and second phases, respectively.

24 Claims, 2 Drawing Sheets

(51) Int. Cl.
    *G01L 1/12*   (2006.01)
    *G01D 5/14*   (2006.01)

(56) References Cited

U.S. PATENT DOCUMENTS

| | | | | |
|---|---|---|---|---|
| 5,604,433 | A | * | 2/1997 | Theus et al. ................. 324/251 |
| 6,104,187 | A | * | 8/2000 | Marx et al. ............... 324/207.21 |
| 6,304,074 | B1 | * | 10/2001 | Waffenschmidt ............ 324/202 |
| 2008/0238410 | A1 | | 10/2008 | Charlier et al. |
| 2010/0060263 | A1 | * | 3/2010 | Granig et al. ................ 324/202 |
| 2013/0069641 | A1 | | 3/2013 | Motz |
| 2013/0300402 | A1 | * | 11/2013 | Liu et al. ...................... 324/202 |
| 2013/0338956 | A1 | * | 12/2013 | Zieren et al. ................. 702/104 |
| 2014/0003464 | A1 | | 1/2014 | Ausserlechner et al. |
| 2014/0028304 | A1 | | 1/2014 | Ausserlechner |
| 2014/0084911 | A1 | | 3/2014 | Ausserlechner |

OTHER PUBLICATIONS

Specification (including claims and abstract), Drawings and Filing Receipt for U.S. Appl. No. 13/753,190, filed Jan. 29, 2013, inventor Ausserlechner.

Specification (including claims and abstract), Drawings and Filing Receipt for U.S. Appl. No. 13/920,777, filed Jun. 18, 2013, inventor Ausserlechner.

Specification (including claims and abstract), Drawings and Filing Receipt for U.S. Appl. No. 14/056,627, filed Oct. 17, 2013, inventors Granig et al.

* cited by examiner

SENSOR OFFSET ERROR COMPENSATION SYSTEMS AND METHODS USING A CORRECTION FACTOR

TECHNICAL FIELD

The invention relates generally to sensors and more particularly to compensating for offset errors in sensors.

BACKGROUND

Sensors often are used as sensor bridges, for example with four identical sensor elements coupled in a Wheatstone bridge configuration. Bridge circuits are supplied by a voltage or current and provide a differential output voltage. Examples include stress sensors, magnetoresistive sensors, and Hall plates and vertical Hall devices, among others.

A common problem with sensor bridges, however is offset error. Offest is the output signal in the absence of the physical quantity which the sensor should detect. For example, for Hall plates the offset is the output signal at zero applied magnetic field, and for stress sensors it is the output signal at zero mechanical stress. The origin of offset error typically is a slight mismatch between the sensor elements of the bridge. In other words, the "identical" sensor elements are not exactly identical. A typical mismatch is on the order of about 0.1% to about 1%, which means that although the four sensor elements have identical resistances they actually differ by about 0.1-1%.

Conventional approaches include, for Hall sensors, using the spinning current principle which uses different sensor elements in multiple clock phases to cancel any offset and enhance magnetic field proportional terms in the signals. This technique can be extended to more than two clock phases by reversing supply polarities and using more than four sensor elements. This technique, however, still results in a small offset error, referred to as the residual offset. The residual offset typically is on the order of about 30 micro-Tesla for Hall plates and about 0.5-1 mT for vertical Hall devices.

Therefore, there is a need for improved offset error compensation for sensors.

SUMMARY

Embodiments relate to offset error compensation in sensors. In an embodiment, a sensor configured to sense a physical characteristic comprises at least one sensor element having an output, wherein an output signal comprises an offset error in an absence of the physical characteristic; an input quantity other than the physical characteristic that affects the offset error, wherein in a first phase of operation of the sensor a first input quantity produces a first output signal having a first offset error, and wherein in a second phase of operation of the sensor a second input quantity different from the first input quantity produces a second output signal having a second offset error; and offset correction circuitry coupled to the output and configured to provide a sensor output signal comprising a sum of the first output signal and a product of the second output signal and a correction factor chosen to offset a difference between the first offset error and the second offset error.

In an embodiment, a method comprises operating a sensor in a first operating phase having a first sensor input quantity to obtain a first sensor output signal and a first sensor offset error; operating the sensor in a second operating phase having a second sensor input quantity to obtain a second sensor output signal and a second sensor offset error; and providing a total sensor output signal comprising the sum of the first and second sensor output signals adjusted by a offset correction factor related to the first and second sensor offset errors.

In an embodiment, a sensor comprises at least one sensor element configured to sense a characteristic and having an input and an output; and offset compensation circuitry coupled to the output and configured to cancel an offset error of the sensor by correcting an output signal of the at least one sensor by a correction factor related to an offset error of the sensor when operated in a first phase and an offset error of the sensor when operated in a second phase.

BRIEF DESCRIPTION OF THE DRAWINGS

The invention may be more completely understood in consideration of the following detailed description of various embodiments of the invention in connection with the accompanying drawings, in which.

Figure 1:
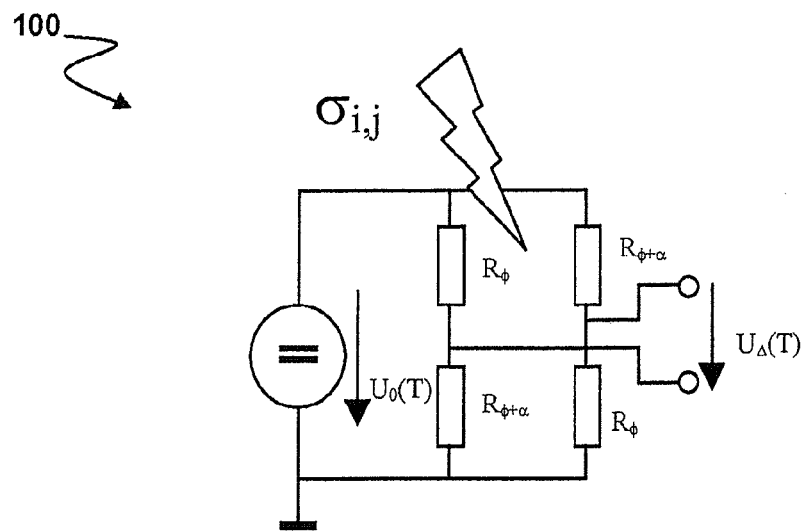
FIG. 1 is a diagram of a stress sensor circuit according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to reducing offset error in sensor systems. In embodiments, the sensitivity and offset of a sensor depend differently on some parameter, e.g. voltage, such that operating the sensor at two different values of the parameter can cancel the offset error. Embodiments can have applicability to stress sensors (FIG. 1), Hall plates (FIG. 2), vertical Hall devices (FIG. 3), magnetoresistive sensors and others.

The sensitivity S and offset Off of a sensor depend differently on certain parameters, such as the supply voltage. In embodiments, operating the sensor at a first supply voltage Usup1 and a second supply voltage Usup2 provides two different output signals Ua1 and Ua2 that each depend on two unknowns: the physical quantity Q to be measured by the sensor and the Offset Off. In other words:

$$Ua1 = S1\,Q + \text{Off1}$$

$$Ua2 = S2\,Q + \text{Off2}$$

Some linear combination of the signals can be found which will cancel the offsets:

$$Ua1 + kUa2 = (S1 + kS2)Q + (\text{Off1} + k\text{Off1})$$

where $k = -\text{Off1}/\text{Off2}$. Thus, the offset, or zero point error, is removed:

$$Ua,\text{total} = Ua1 + kUa2 = (S1 + kS2)Q$$

Embodiments typically will not be applicable to perfectly linear sensors, those for which both sensitivity and offset depend in the same way on the parameter, such voltage. In practice, however, sensors are rarely perfectly linear, and all semiconductor sensors are nonlinear due to junction field effects. Therefore, embodiments are generally and widely applicable.

A first example embodiment relates to the stress sensor 100 of FIG. 1, of which the individual resistors $R_n$ are diffused resistors in silicon and the resistors $R_n$ are aligned in two different directions, $\phi$ and $\phi+\alpha$. In an embodiment, a 1V supply voltage is applied to bridge circuit 100, and the output voltage Ua1 is measured. Then, a 2V supply voltage is applied to bridge circuit 100, and the output voltage again is measured. The 1V and 2V supply voltage values are merely exemplary for purposes of this example and can vary in embodiments. Typically the sensitivity of bridge 100 with respect to mechanical stress is directly proportional to the supply voltage, yet the resistance and thus the offset voltage is not purely directly proportional to the supply voltage but contains some quadratic terms. Therefore, the offset error of bridge 100 at 2V is more than twice the offset voltage at 1V. For this example discussion, it is assumed that this factor is 2.1, which will vary in embodiments.

Next, the output voltage at the second voltage Ua2 is divided by the factor 2.1 and then the output voltage at the first supply Ua1 is subtracted from the result. This removes the offset error. Mathematically:

$$Ua1(U\text{sup}=1V)=S(U\text{sup}=1V)*STRESS+\text{Off}(U\text{sup}=1V)$$

$$Ua2(U\text{sup}=2V)=S(U\text{sup}=2V)*STRESS+\text{Off}(U\text{sup}=2V)$$

with $$S(U\text{sup}=2V)=2*S(U\text{sup}=1V)$$

and $$\text{Off}(U\text{sup}=2V)=2.1*\text{Off}(U\text{sup}=1V).$$

Then the following is determined:

$$Ua2(U\text{sup}=2V)/2.1-Ua1(U\text{sup}=1V)$$

which is identical to $$(S(U\text{sup}=2V)/2.1-S(U\text{sup}=1V))*STRESS$$

because the terms $$\text{Off}(U\text{sup}=2V)/2.1-\text{Off}(U\text{sup}=1V)=0.$$

Figure 2:
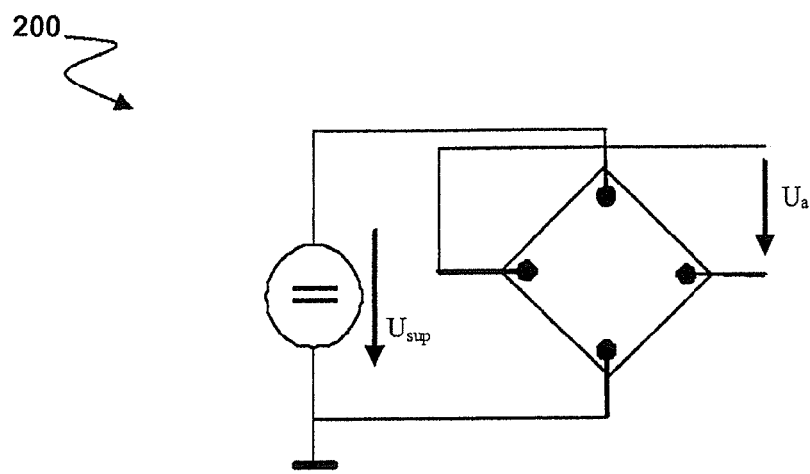
FIG. 2 is a diagram of a Hall plate circuit according to an embodiment.
Figure 3:
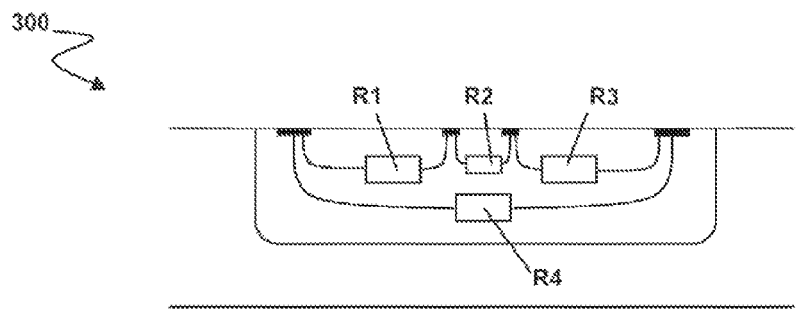
FIG. 3 is a diagram of a vertical Hall circuit according to an embodiment.

Referring to FIGS. 2 and 3, other examples relate to Hall effect devices, such as ordinary Hall plates 200 or vertical Hall devices 300. In embodiments, the aforementioned spinning current technique is used, in which the Hall device has several contacts, some of which are used as supply terminals and others as sense terminals in a first clock phase, and in other clock phases the roles of supply and sense terminals are exchanged and the signs of voltage or current supplies inverted. The sensed signals are then added with proper signs. After adding all of the signals with proper signs, the sensor has a first output signal Ua1 with a first residual zero point offset Off1. Next, the sensor system operates Hall device 200 or 300 at a different supply voltage or supply current, which provides a different magnetic sensitivity, a different second output signal Ua2 and a different second residual zero point error Off2. Finally the total output can be calculated:

$$Ua\_\text{total}=Ua1+k*Ua2$$

where k=−Off1/Off2.

Another example embodiment relates to magnetoresistive sensor bridges, such as giant magnetoresistive (GMR) sensors. In this embodiment, instead of applying two different voltages, two different magnetic fields are applied. These fields are referred to as secondary fields to distinguish them from the primary field from an external source to be detected by the sensor. The sensor system has control over the secondary magnetic field but not the primary. In embodiments, therefore, an electromagnet, coil, wire or other source is arranged proximate the GMR sensor bridge in order to generate the secondary magnetic field when the system injects some current through it. In particular, the secondary magnetic field can be orthogonal to the primary magnetic field, and the GMR can be constructed in such a way so as to respond mainly on the primary magnetic fields and only with much lower sensitivity to the secondary magnetic fields.

In operation, the sensor system can apply a first secondary magnetic field (e.g. zero) to the GMRs and sample the output signal Ua1:

$$Ua1=S1*Bx+\text{Off}(By1)$$

where S1 is the magnetic sensitivity of the sensor bridge during this first operating phase, Bx is the primary magnetic field to be detected by the system and Off is the offset error of the bridge, which is assumed to be a function of the secondary magnetic field By1, where Bx and By1 are perpendicular to one another.

Next, a second secondary magnetic field is applied to the GMRs, and the output signal Ua2 is sampled:

$$Ua2=S2*Bx+\text{Off}(By2)$$

Finally, the total output is determined:

$$Ua\_\text{total}=Ua1+k*Ua2$$

where k=−Off(By1)/Off(By2). Thus:

$$Ua\_\text{total}=(S1+k*S2)*Bx$$

which no longer has offset error.

While examples comprising bridge configurations have been given, bridges need not be used. The GMR embodiment, for example, does not rely on any bridge property.

Figure 4:
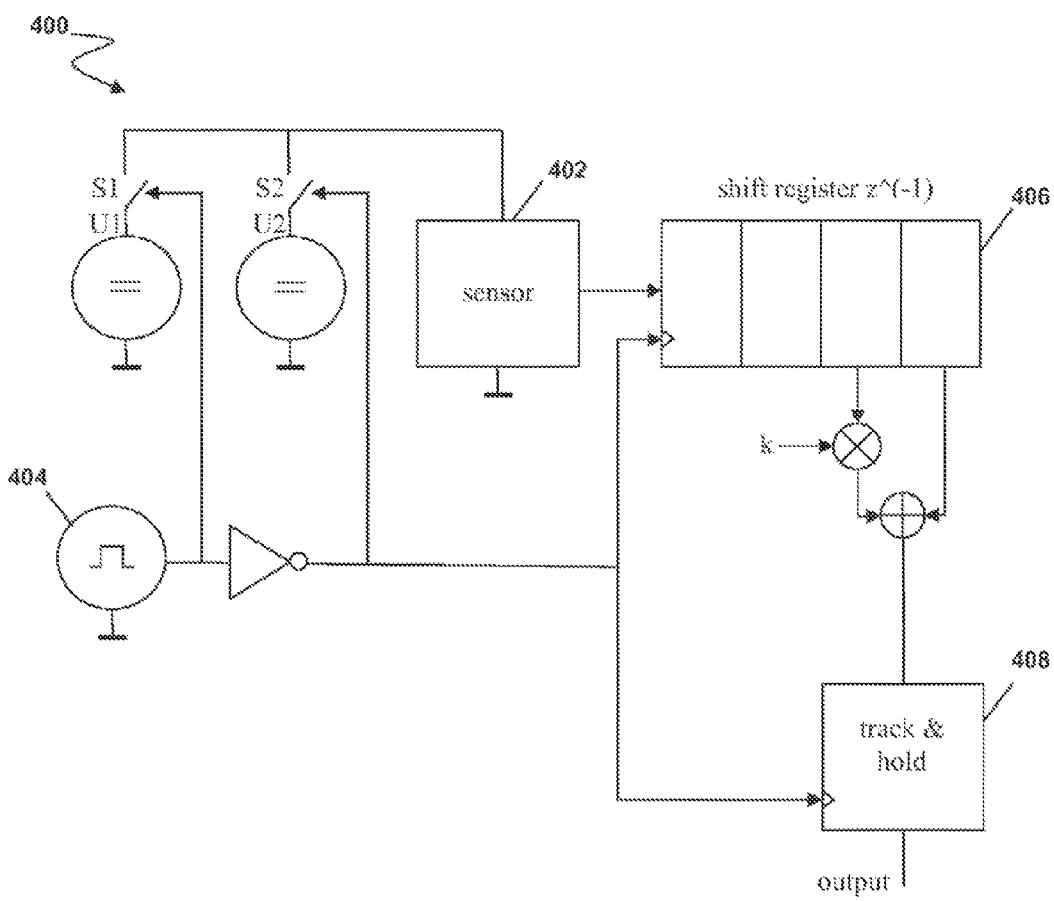
FIG. 4 is a diagram of an offset correction circuit according to an embodiment.

In view of the above-discussed embodiments, and referring to FIG. 4, an example offset correction circuit 400 according to embodiments is depicted. Circuit 400 comprises at least one sensor 402, such as any of the sensors discussed herein above. Sensor 402 is supplied by two supplies, U1 and U2, sequentially, via switches S1 and S2 and clocked by a master clock oscillator 404 in an embodiment. An output signal of sensor 402 can be amplified in embodiments by an analog-to-digital converter (not shown in FIG. 4) and fed to a shift register 406 synchronously with master clock 404. The n-th value in shift register 406 is delayed by n clock cycles and is multiplied by a suitable chosen constant k and added to the (n+1)-th value in shift register 406. The result is sampled in a track and hold circuit 408 and is the offset compensated output.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A sensor configured to sense a physical characteristic comprising:
   at least one sensor element having an output, wherein an output signal comprises an offset error in an absence of the physical characteristic;
   an input quantity other than the physical characteristic that affects the offset error, wherein in a first phase of operation of the sensor a first input quantity produces a first output signal having a first offset error, and wherein in a second phase of operation of the sensor a second input quantity different from the first input quantity produces a second output signal having a second offset error; and
   offset correction circuitry coupled to the output and configured to:
     generate a correction factor based on the first offset error and the second offset error;
     generate a corrected second output signal based on the correction factor and the second output signal; and
     generate a sensor output signal based on the first output signal and the corrected second output signal to offset a difference between the first offset error and the second offset error.

2. The sensor of claim 1, wherein the input quantity is selected from the group consisting of a voltage, a current or a bias magnetic field.

3. The sensor of claim 1, wherein the at least one sensor is selected from the group consisting of a Hall-effect sensor, a vertical Hall sensor, a spinning current vertical Hall sensor, a magnetoresistive sensor, and a stress sensor.

4. The sensor of claim 1, wherein the at least one sensor element comprises a plurality of sensor elements coupled in a sensor bridge.

5. The sensor of claim 1, wherein the offset correction circuitry comprises a shift register coupled to the output, and wherein the first and second output signals are stored by the shift register.

6. The sensor of claim 1, wherein the correction factor comprises −1 * (the first offset error)/(the second offset error).

7. The sensor of claim 1, wherein the sensor output signal is generated based on a sum of the first output signal and the corrected second output signal.

8. The sensor of claim 7, wherein the corrected second output signal is generated by weighting the second output signal by the by the correction factor.

9. The sensor of claim 7, wherein the corrected second output signal is generated based on a product of the second output signal and the correction factor.

10. A method comprising:
    operating a sensor in a first operating phase having a first sensor input quantity to obtain a first sensor output signal and a first sensor offset error;
    operating the sensor in a second operating phase having a second sensor input quantity to obtain a second sensor output signal and a second sensor offset error;
    calculating an offset correction factor based on the first sensor offset error and the second sensor offset error;
    calculating a corrected second senor output signal based on the offset correction factor and the second sensor output signal; and
    generating a total sensor output signal based on the first sensor output signal and the corrected second sensor output signal.

11. The method of claim 10, wherein calculating the offset correction factor comprises:
    dividing the first sensor offset error by the second sensor offset error and multiplying the result by −1.

12. The method of claim 10, wherein;
    calculating the corrected second sensor output signal comprises:
      multiplying the second sensor output signal by the offset correction factor; and
    generating the total output signal comprises:
      summing the first sensor output signal with the corrected second sensor output signal.

13. The method of claim 10, wherein the offset correction factor cancels or substantially cancels an offset error of the sensor.

14. The method of claim 10, wherein the first and second sensor input quantities are selected from the group consisting of a voltage, a current and a magnetic field.

15. The method of claim 10, wherein the sensor has an offset error in the absence of a physical quantity to be sensed by the sensor.

16. The method of claim 15, wherein the physical quantity comprises a magnetic field, a voltage, a current, or a temperature.

17. A sensor comprising:
    at least one sensor element configured to sense a characteristic and having an input and an output; and
    offset compensation circuitry coupled to the output and configured to correct an output signal of the at least one sensor by a correction factor to cancel an offset error of the sensor, the output signal including a first output signal of the at least one sensor operating in a first phase and a second corrected output signal of the at least one sensor operating in a second phase, wherein the correction factor is calculated based on an offset error of the at least one sensor when operated in the first phase and an offset error of the at least one sensor when operated in the second phase, the second corrected output signal being based on a second output signal of the at least one sensor operating in the second phase and the correction factor.

18. The sensor of claim 17, wherein a signal at the input of the at least one sensor element is different in the first phase and the second phase.

19. The sensor of claim 18, wherein a signal at the output of the at least one sensor element is different in the first phase and the second phase.

20. The sensor of claim 17, wherein calculating the correction factor comprises:

dividing the offset error in the first phase by the offset error in the second phase and multiplying the result by −1.

21. The sensor of claim 17, wherein the sensor comprises a magnetic field sensor, a stress sensor, or a current sensor.

22. The sensor of claim 17, wherein the output signal of the at least one sensor comprises a sum of the first output signal and the second corrected output signal.

23. The sensor of claim 22, wherein the second corrected output signal comprises a product of the second output signal of the at least one sensor and the correction factor.

24. The sensor of claim 17, wherein offset compensation circuitry is further configured to calculate the correction factor.

* * * * *